(12) United States Patent
Murata (10) Patent No.: US 8,963,141 B2
(45) Date of Patent: Feb. 24, 2015

(54) THIN-FILM TRANSISTOR, FABRICATION METHOD THEREOF, AND IMAGE DISPLAY DEVICE

(71) Applicant: Toppan Printing Co., Ltd., Tokyo (JP)

(72) Inventor: Kodai Murata, Tokyo (JP)

(73) Assignee: Toppan Printing Co., Ltd. (JP)

( * ) Notice: Subject to any disclaimer, the term of this patent is extended or adjusted under 35 U.S.C. 154(b) by 150 days.

(21) Appl. No.: 13/786,039

(22) Filed: Mar. 5, 2013

(65) Prior Publication Data

US 2013/0181200 A1   Jul. 18, 2013

Related U.S. Application Data

(63) Continuation of application No. PCT/JP2011/070131, filed on Sep. 5, 2011.

(30) Foreign Application Priority Data

Sep. 22, 2010   (JP) .................................. 2010-212684

(51) Int. Cl.
| | | |
|---|---|---|
| H01L 35/24 | (2006.01) | |
| H01L 51/00 | (2006.01) | |
| H01L 29/786 | (2006.01) | |
| H01L 27/12 | (2006.01) | |
| H01L 51/05 | (2006.01) | |
| H01L 29/66 | (2006.01) | |

(52) U.S. Cl.
CPC ...... *H01L 29/78609* (2013.01); *H01L 27/1225* (2013.01); *H01L 29/7869* (2013.01); *H01L 51/0012* (2013.01); *H01L 51/0516* (2013.01); *H01L 29/66969* (2013.01); *H01L 27/1292* (2013.01)
USPC ................................ 257/40; 257/43; 438/158

(58) Field of Classification Search
CPC ..................... H01L 29/7869; H01L 29/66969; H01L 29/78606; H01L 29/4908
USPC ........................................ 257/40, 43; 438/158
See application file for complete search history.

(56) References Cited

U.S. PATENT DOCUMENTS

2010/0117076 A1\* 5/2010 Akimoto et al. ................ 257/43

FOREIGN PATENT DOCUMENTS

| JP | 09-139508 | 5/1997 |
|---|---|---|
| JP | 2004-080026 | 3/2004 |
| JP | 2005-210086 | 8/2005 |
| JP | 2006-186293 | 7/2006 |
| JP | 2007-250842 | 9/2007 |
| JP | 2010-135772 | 6/2010 |

OTHER PUBLICATIONS

Translated International Preliminary Report on Patentability for PCT/JP2011/070131, mailed Apr. 25, 2013, 7 pgs.

\* cited by examiner

*Primary Examiner* — Theresa T Doan
(74) *Attorney, Agent, or Firm* — Squire Patton Boggs (US) LLP (57) ABSTRACT

A method for fabricating a thin-film transistor is provided whereby isolation of transistor devices is realized and the performance and the stability of the product thin-film transistor are improved. The thin-film transistor includes a substrate; a gate electrode laminated on the substrate; a gate insulating layer laminated on the substrate and the gate electrode; a recessed portion provided in the gate insulating layer; a semiconductor layer formed in the recessed portion of the gate insulating layer; and a source electrode and a drain electrode connected to the semiconductor layer at respective positions which are spaced apart from each other.

7 Claims, 6 Drawing Sheets

THIN-FILM TRANSISTOR, FABRICATION METHOD THEREOF, AND IMAGE DISPLAY DEVICE

CROSS-REFERENCE TO RELATED APPLICATION

This application is a continuation of International Application No. PCT/JP2011/070131, filed Sep. 5, 2011, the entire contents of which is incorporated herein by reference.

BACKGROUND OF THE INVENTION

1. Field of the Invention

The present invention relates to a thin-film transistor, a fabrication method thereof, and an image display device.

2. Background Art

With rapid advances in information technology, sending and receiving of information through devices such as laptop personal computers and portable information terminals have not been more extensive. It is commonly accepted that the ubiquitous society, where people can exchange information at any place, is the trend of the future. Lighter and thinner information terminals are thus desired of such an information society.

Currently, the mainstream semiconductor materials are silicon (Si) based. However, transistors that use oxide semiconductors (oxide transistors) have been actively studied from various perspectives, including flexibility, lightness, cost, and performance. Vacuum deposition such as sputtering is typically used for oxide semiconductors.

In recent years, there have been reports of oxide semiconductors formed by coating. This has widened the range of potential applications such as increasing the product area, use of the printing method, and use of plastic substrates.

The applicable areas include a wide range of fields, including thin and light-weight flexible displays, and, potentially, RFID (Radio Frequency Identification) tags and sensors. Indeed, studies of coating-type oxide transistors are essential for the advent of the ubiquitous society.

For these and other reasons, studies of oxide semiconductors that employ coating have attracted interest.

Spin coating, dipping, and inkjet methods are among the methods of forming a semiconductor layer from a solution. Spin coating and dipping can be used to fabricate a transistor array that includes a plurality of transistors. A problem of such transistor arrays, however, is that a current easily flows in the semiconductor layer between the transistor devices or between the transistors and the pixel electrode, and increases the OFF-state current (leak current) and lowers the ON/OFF ratio.

As a countermeasure, JP-A-2005-210086 realizes isolation of transistor devices with a semiconductor layer formed at the desired place by using an inkjet method. JP-A-2004-80026 realizes isolation of transistor devices by injecting a semiconductor solution into a channel portion between a source electrode and a drain electrode.

However, injecting a semiconductor solution into a channel portion as in JP-A-2004-80026 requires a partition wall, and the common transistor fabrication additionally requires deposition of the partition wall material and a patterning process.

SUMMARY OF THE INVENTION

The present invention has been completed in view of the foregoing problems, and provides a method for fabricating a high-performance and stable thin-film transistor through isolation of transistor devices.

According to a first aspect of the present invention, there is provided a thin-film transistor that includes:
a substrate;
a gate electrode laminated on the substrate;
a gate insulating layer laminated on the substrate and the gate electrode;
a recessed portion provided in the gate insulating layer;
a semiconductor layer formed in the recessed portion of the gate insulating layer; and
a source electrode and a drain electrode connected to the semiconductor layer at respective positions which are spaced apart from each other.

The thin-film transistor according to the first aspect of the invention may further include a protective film laminated at least on a central portion of the semiconductor layer.

In the thin-film transistor according to the first aspect of the invention, the recessed portion may be formed in a portion opposable to the gate electrode in a thickness direction.

In the thin-film transistor according to the first aspect of the invention, the semiconductor layer may be made of a material that contains a metal oxide as a main component.

In the thin-film transistor according to the first aspect of the invention, the semiconductor layer may be made of a material that contains an organic substance as a main component.

According to a second aspect of the present invention, there is provided an image display device that includes:
the thin-film transistor of the first aspect of the invention;
an interlayer insulating film formed on the source electrode and the drain electrode of the thin-film transistor;
a pixel electrode formed on the interlayer insulating film and electrically connected to the drain electrode; and
a display medium that includes a common electrode formed on the pixel electrode.

In image display device according to the second aspect of the invention, the display medium may be any one of an electrophoretic reflective display device, a transmissive liquid crystal display device, a reflective liquid crystal display device, a semitransmissive liquid crystal display device, an organic EL display device, and an inorganic EL display device.

According to a third aspect of the present invention, there is provided a method for fabricating the thin-film transistor of the first aspect of the invention,
the method including:
forming the gate electrode on the substrate;
forming the gate insulating layer on the substrate and the gate electrode;
forming the recessed portion in the gate insulating layer in a portion opposite the gate electrode;
forming the semiconductor layer in the recessed portion by coating;
forming the protective film at least on the central portion of the semiconductor layer; and
forming the source electrode and the drain electrode on the semiconductor layer in a manner that allows the source electrode and the drain electrode to be connected to the semiconductor layer at respective positions which are spaced apart from each other.

In the method according to the third aspect of the invention, the coating may be any one of relief printing, intaglio printing, planographic printing, reverse offset printing, screen printing, an inkjet method, thermal transfer printing, a dispensing method, spin coating, die coating, microgravure coating, and dip coating.

In the method according to the third aspect of the invention, the recessed portion may be formed by dry etching.

The present invention directly forms the recessed portion in the gate insulating layer, enabling the semiconductor layer to be deposited at the desired place by coating, and realizing isolation of the transistor devices.

The invention also enables stable driving of transistor device, and can simplify the fabrication process by eliminating the process of forming a partition wall.

DESCRIPTION OF THE PREFERRED EMBODIMENT

An embodiment of the present invention is described below with reference to the accompanying drawings. It should be noted that the structure of the thin-film transistor according to the embodiment of the present invention is not particularly limited.

Figure 1:
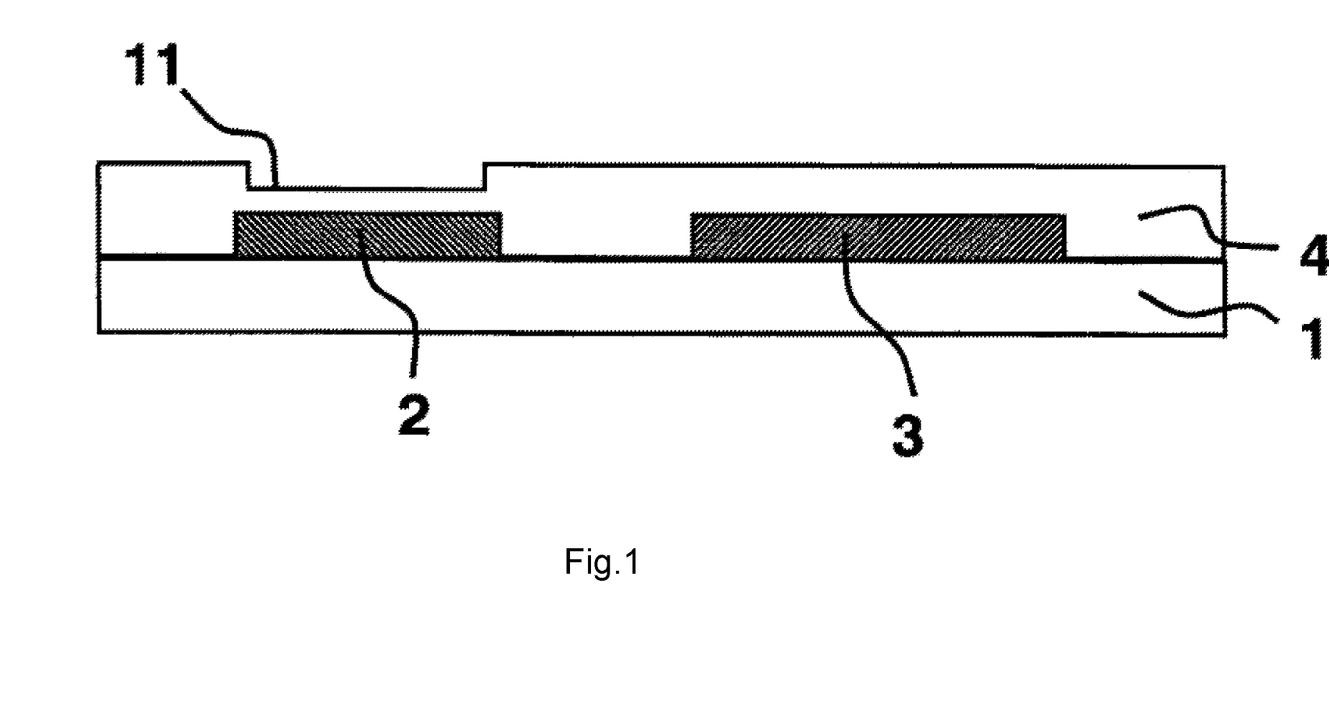
FIG. 1 is a partial cross sectional view of a recessed portion formed in a gate insulating layer provided directly above a gate electrode according to an embodiment of the present invention.
Figure 2:
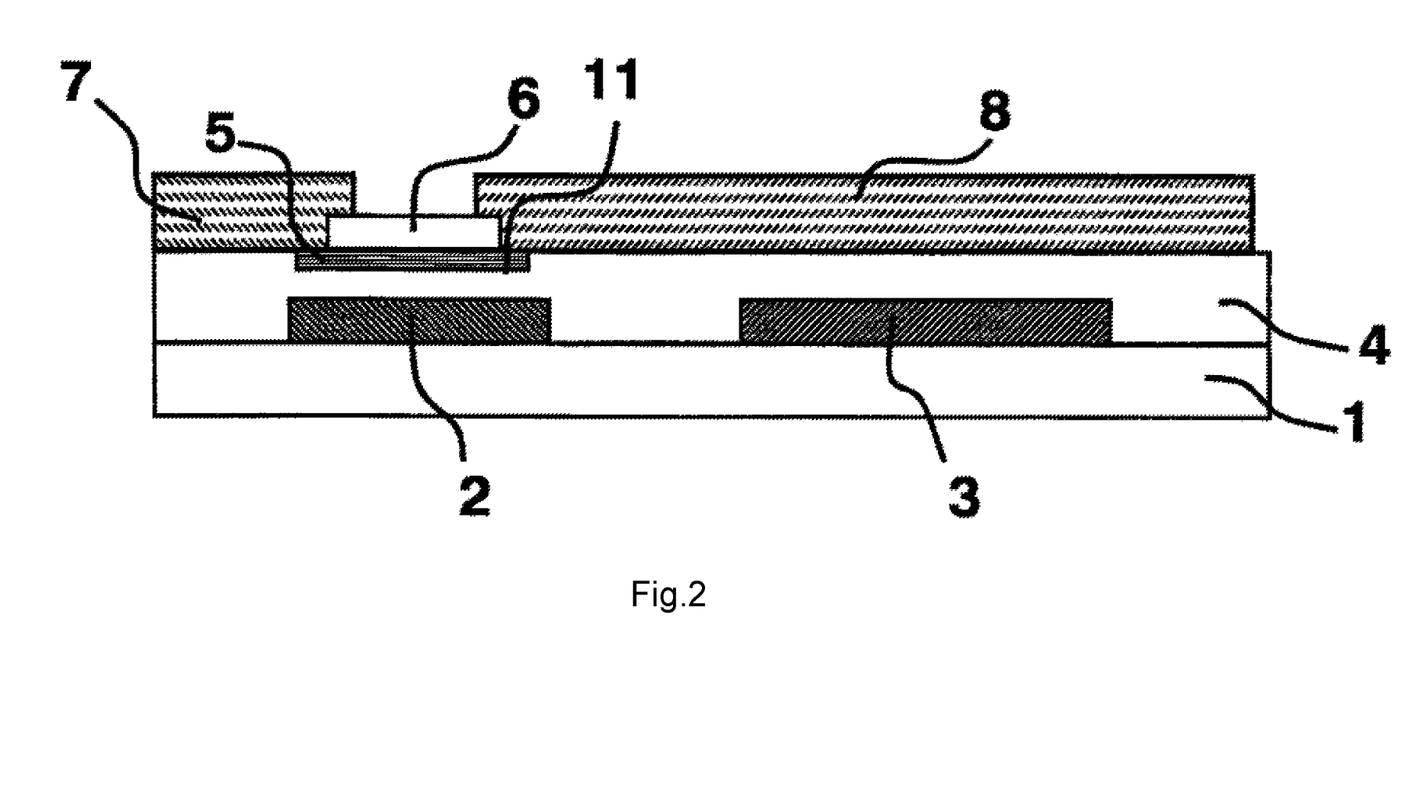
FIG. 2 is a partial cross sectional view illustrating substantially one pixel portion of a thin-film transistor according to the embodiment of the present invention.

As illustrated in FIGS. 1 and 2, the thin-film transistor according to the present embodiment includes a substrate 1, a gate electrode 2 and a capacitor electrode 3 laminated on the substrate 1, a gate insulating layer 4 laminated on the substrate 1, the gate electrode 2, and the capacitor electrode 3, a recessed portion 11 provided in the gate insulating layer 4, a semiconductor layer 5 formed in the recessed portion 11 of the gate insulating layer 4, and a source electrode 7 and a drain electrode 8 connected to the semiconductor layer 5 at respective positions which are spaced apart from each other. The recessed portion 11 is formed directly above the gate electrode 2. More than one thin-film transistor is formed on the substrate 1.

Figure 4:
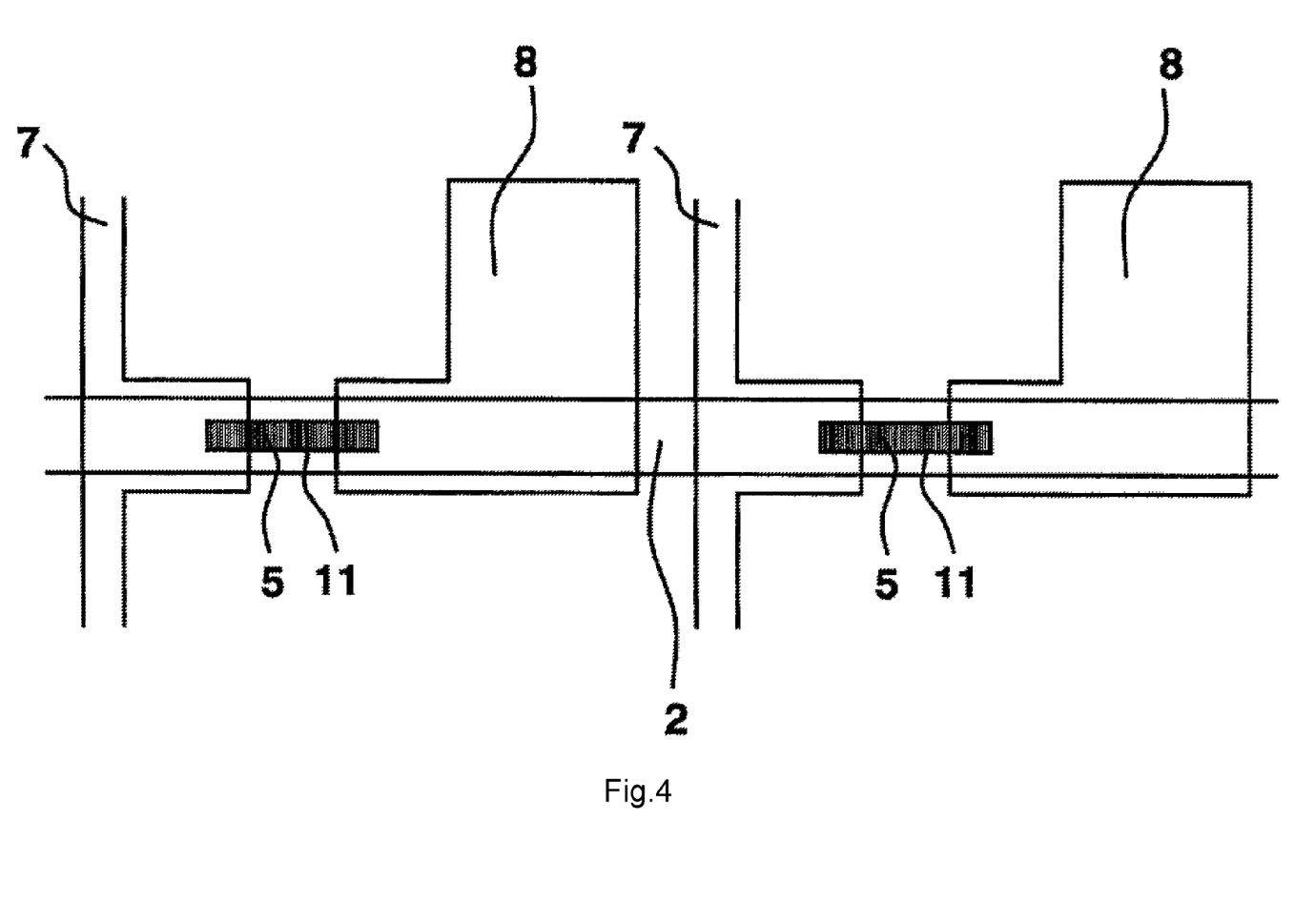
FIG. 4 is an array diagram illustrating a portion of the thin-film transistor according to the embodiment of the present invention.

The recessed portion 11 has a shape that allows the semiconductor layer 5 formed in the recessed portion 11 to be connected to the source electrode 7 and the drain electrode 8. It is, however, desirable that the recessed portion 11 be formed at least directly above the gate electrode 2 (opposite the gate electrode 2 in the thickness direction), without jutting out of the area directly above the gate electrode 2. As illustrated in FIG. 4, more than one recessed portion 11 is formed on the gate electrode 2. Desirably, the recessed portions 11 are spaced apart from each other without being connected to each other. The recessed portion 11 may be, for example, rectangular in shape with the longer sides parallel to the longer sides of the gate electrode 2, or ellipsoidal. However, the recessed portion 11 is not limited to these shapes, and may have any shape, as long as it can be formed by dry etching, as will be described later in conjunction with the method of forming the recessed portion 11.

The substrate 1 of the present embodiment may be formed by using materials such as polymethyl methacrylate, polyacrylate, polycarbonate, polystyrene, polyethylene sulfide, polyethersulfone, polyolefin, polyethylene terephthalate, polyethylene naphthalate, cycloolefin polymer, polyether sulfone, triacetyl cellulose, polyvinyl fluoride film, ethylene-tetrafluoroethylene copolymer resin, weather-resistant polyethylene terephthalate, weather-resistant polypropylene, glass fiber-reinforced acryl resin film, glass fiber-reinforced polycarbonate, transparent polyimide, fluororesin, cyclic polyolefin resin, glass, and quartz. Note, however, that the substrate 1 of the present embodiment is not limited to these. These may be used either alone or as a composite laminate of two or more.

When the substrate 1 of the present embodiment is an organic film, a transparent gas barrier layer (not illustrated) may be formed to improve the durability of the thin-film transistor devices. The gas barrier layer may be formed of materials, for example, such as aluminum oxide ($Al_2O_3$), silicon oxide ($SiO_2$), silicon nitride (SiN), silicon oxynitride (SiON), silicon carbide (SiC), and diamond-like carbon (DLC). Note, however, that the substrate 1 of the present embodiment is not limited to these. These gas barrier layers may be used as a laminate of two or more layers. The gas barrier layer may be formed only on one side or on both sides of the organic film forming the substrate 1.

The gas barrier layer may be formed by methods, for example, such as vacuum deposition, ion plating, sputtering, laser abrasion, plasma CVD (Chemical Vapor Deposition), hot wire CVD, and a sol-gel method. The method used in the present invention is not limited to these.

The gate electrode 2, the capacitor electrode 3, the source electrode 7, and the drain electrode 8 of the present embodiment are preferably formed by using oxide materials, for example, such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_2$), zinc tin oxide ($Zn_2SnO_4$), and indium zinc oxide (In—Zn—O). For increased conductivity, it is preferable to dope these oxide materials with impurities. For example, tin-, molybdenum-, or titanium-doped indium oxide, antimony- or fluorine-doped tin oxide, and indium-, aluminum-, or gallium-doped zinc oxide may be used. Of these, tin-doped indium oxide, or indium tin oxide (ITO) as it is called is particularly preferable for its low resistivity. Metallic materials such as Au, Ag, Cu, Cr, Al, and Mg also may be preferably used. A laminate of conductive oxide materials and low-resistance metallic materials also may be used.

In this case, particularly preferred for use in preventing oxidation or aging of the metallic materials is a laminate of a three-layer structure including a conductive oxide thin film, a metallic thin film, and a conductive oxide thin film, formed in this order. Organic conductive materials such as PEDOT (polyethylene dioxythiophene) also may be preferably used. The gate electrode 2, the source electrode 7, and the drain electrode 8 may be made of the same material or different materials. However, it is more preferable to use the same material for the source electrode 7 and the drain electrode 8, because it can reduce the number of fabrication steps.

The electrodes 2, 3, 7, and 8 may be formed by using various methods. Non-limiting examples include vacuum deposition, ion plating, sputtering, laser abrasion, plasma CVD (Chemical Vapor Deposition), photo CVD, hot wire CVD, screen printing, relief printing, and an inkjet method.

Examples of the materials used for the gate insulating layer 4 used in the thin-film transistor according to the present embodiment include, but are not limited to, inorganic materials such as silicon oxide, silicon nitride, silicon oxynitride, aluminum oxide, tantalum oxide, yttrium oxide, hafnium oxide, hafnium aluminate, zirconia oxide, and titanium oxide, polyacrylates (such as PMMA; polymethyl methacrylate), PVA (polyvinyl alcohol), PS (polystyrene), transparent polyimide, polyester, epoxy, polyvinyl phenol, and polyvinyl alcohol. In order to suppress gate leak current, the resistivity of the insulating material is $10^{11}$ Ω·cm or more, preferably $10^{14}$ Ω·cm or more.

The gate insulating layer 4 is formed by using methods such as vacuum deposition, ion plating, sputtering, laser abrasion, plasma CVD, photo CVD, hot wire CVD, spin coating, dip coating, and screen printing. Materials having a gradient composition in the film growth direction also may preferably be used for the gate insulating layer 4.

As illustrated in FIGS. 1 to 4, the recessed portions 11 formed in the gate insulating layer 4 of the thin-film transistor according to the present embodiment lie directly above the gate electrode 2, and are spaced apart from each other. The recessed portions 11 are directly formed in the gate insulating layer 4 by using the common dry etching technique.

The semiconductor layer 5 used in the thin-film transistor according to the present embodiment is formed by using organic semiconductor materials or oxide semiconductor materials that contain organic material or metallic oxide as the main component. The organic semiconductor layer or the oxide semiconductor layer is formed upon coating the recessed portions 11 with an ink prepared by dissolving or dispersing these materials in a solvent.

The organic semiconductor materials may be high-molecular organic semiconductor materials such as polythiophene, polyallylamine, fluorene-bithiophene copolymer, and derivatives thereof, and low-molecular organic semiconductor materials such as pentacene, tetracene, copper phthalocyanine, perylene, and derivatives thereof. Considering cost, flexibility, and area size, it is desirable to use the organic semiconductor materials usable for coating. Carbon compounds such as carbon nanotubes and fullerenes, and semiconductor nanoparticle dispersions also may be used as semiconductor materials.

Examples of the solvent used to dissolve or disperse the organic semiconductor materials include cyclic ether solvents (such as tetrahydrofuran, and dioxane), ketone solvents (such as acetone, and methylethylketone), alcohol solvents (such as ethanol, and IPA), halogenated alkyl solvents (such as chloroform, and 1,2-dichloroethane), aromatic solvents (such as toluene, xylene, dichlorobenzene, and trichlorobenzene), N-methylpyrrolidone, sulfolane, carbon disulfide, and water. These may be used either alone or as a mixture.

The organic semiconductor layer 5 may be coated by using known methods, including, for example, relief printing, intaglio printing, planographic printing, reverse offset printing, screen printing, an inkjet method, thermal transfer printing, a dispensing method, spin coating, die coating, microgravure coating, and dip coating.

Non-limiting examples of the oxide semiconductor materials for use in the present invention include oxides that contain at least one element selected from zinc (Zn), indium (In), tin (Sn), tungsten (W), magnesium (Mg), and gallium (Ga), specifically, zinc oxide (ZnO), indium oxide ($In_2O_3$), indium zinc oxide (In—Zn—O), tin oxide ($SnO_2$), tungsten oxide (WO), and indium gallium zinc oxide (In—Ga—Zn—O). The structure of these materials may be any of monocrystal, polycrystal, microcrystal, a crystal-amorphous mixture, nanocrystal dispersed amorphous, and amorphous.

Examples of the solvent used to dissolve or disperse the oxide semiconductor materials include cyclic ether solvents (such as tetrahydrofuran, and dioxane), ketone solvents (such as acetone, and methylethylketone), alcohol solvents (such as ethanol, and IPA), halogenated alkyl solvents (such as chloroform, and 1,2-dichloroethane), aromatic solvents (such as toluene, xylene, dichlorobenzene, and trichlorobenzene), N-methylpyrrolidone, sulfolane, carbon disulfide, and water. These may be used either alone or as a mixture.

The oxide semiconductor layer 5 may be coated by using known methods, including, for example, relief printing, intaglio printing, planographic printing, reverse offset printing, screen printing, an inkjet method, thermal transfer printing, a dispensing method, spin coating, die coating, microgravure coating, and dip coating.

Examples of the materials used for a protective film 6 according to the present embodiment include, but are not limited to, inorganic materials such as silicon oxide, silicon nitride, silicon oxynitride, aluminum oxide, tantalum oxide, yttrium oxide, hafnium oxide, hafnium aluminate, zirconia oxide, and titanium oxide, polyacrylates (such as PMMA; polymethyl methacrylate), PVA (polyvinyl alcohol), PS (polystyrene), transparent polyimide, polyester, epoxy, polyvinyl phenol, and polyvinyl alcohol. In order to prevent any electrical adverse effects on the thin-film transistor, the resistivity of the protective film 6 is preferably $10^{11}$ Ω·cm or more, particularly preferably $10^{14}$ Ω·cm or more.

The protective film 6 is formed by using methods such as vacuum deposition, ion plating, sputtering, laser abrasion, plasma CVD, photo CVD, hot wire CVD, spin coating, dip coating, and screen printing. Materials having a gradient composition in the film growth direction also may preferably be used for the protective film 6.

Image Display Device

An image display device using the thin-film transistor of FIG. 2 is described below with reference to FIG. 3.

Figure 3:
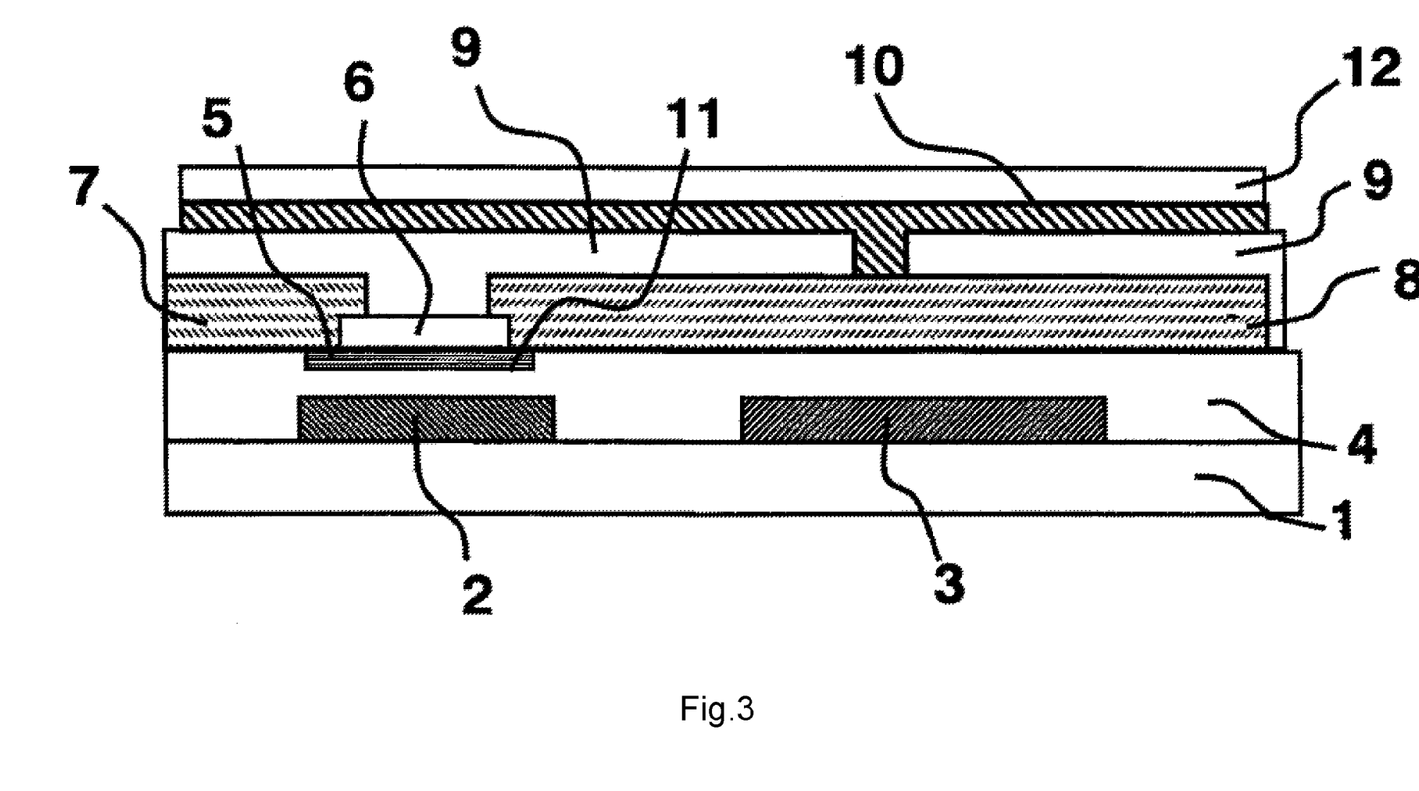
FIG. 3 is a schematic plan view of an image display device that uses the thin-film transistor according to the embodiment of the present invention.

As illustrated in FIG. 3, the image display device includes the thin-film transistor, an interlayer insulating film 9 formed on the source electrode 7 and the drain electrode 8 of the thin-film transistor, a pixel electrode 10 formed on the interlayer insulating film 9 and electrically connected to the drain electrode 8, and a display medium 12 that includes a common electrode formed on the pixel electrode 10.

Examples of the material of the interlayer insulating film 9 according to the present embodiment include, but are not limited to, inorganic materials such as silicon oxide, silicon nitride, silicon oxynitride, aluminum oxide, tantalum oxide, yttrium oxide, hafnium oxide, hafnium aluminate, zirconia oxide, and titanium oxide, and organic materials such as polyacrylates (such as PMMA; polymethyl methacrylate), polyvinyl alcohol (PVA), polystyrene (PS), transparent polyimide, polyester, epoxy resin, and polyvinyl phenol.

The interlayer insulating film 9 may be made of the same material used for the gate insulating layer 4, or different materials may be used. The interlayer insulating film 9 may be used as a single layer, or as a laminate of more than one layer.

The interlayer insulating film 9 may be formed by using methods such as vacuum deposition, ion plating, sputtering, laser abrasion, plasma CVD, photo CVD, hot wire CVD, spin coating, dip coating, and screen printing. However, the method used in the present invention is not limited to these.

The pixel electrode 10 according to the present embodiment needs to be electrically connected to the drain electrode 8 of the thin-film transistor. Specifically, this can be achieved by, for example, pattern printing the interlayer insulating film 9 by a method such as screen printing in areas excluding a portion of the drain electrode 8, or by applying the interlayer insulating film 9 over the whole surface, and forming a hole through the interlayer insulating film 9 by using a laser beam or the like. However, the method used in the present invention is not limited to these.

Examples of the display medium (display device) combined with the thin-film transistor of the present invention include electrophoretic reflective display devices, transmissive liquid crystal display devices, reflective liquid crystal display devices, semitransmissive liquid crystal display devices, organic EL display devices, and inorganic EL display devices.

Example 1

The present inventors fabricated an image display device (FIG. 3) that included the semiconductor active layer (semiconductor layer 5) deposited by coating after directly forming the recessed portion 11 in the gate insulating layer 4 (Example), and studied the relationships between this image display device with an image display device (FIG. 6) fabricated to include the semiconductor active layer deposited by coating after forming a partition wall on the gate insulating layer (Comparative Example).

The image display devices were fabricated with silicon oxynitride (SiON) used as the material of the gate insulating layer 4, In—Zn—O oxide as the material of the semiconductor layer 5, and polyimide as the partition wall material.

An ITO was formed on the substrate 1 in a thickness of 100 nm using DC magnetron sputtering, followed by application of a photosensitive photoresist, exposure, and development with a developer. After etching with hydrochloric acid, the photosensitive photoresist was removed with a remover. The gate electrode 2 and the capacitor electrode 3 were then formed by patterning the ITO (hereinafter, photolithography). Thereafter, the gate insulating layer 4 (SiON; a thickness of 400 nm) was deposited in contact with the substrate 1, using RF magnetron sputtering. After the deposition, a photosensitive photoresist was applied, and, after exposure and development with a developer, the recessed portions 11 were directly formed in the gate insulating layer 4. The recessed portion 11 was formed by reactive ion etching (hereinafter, RIE; an etching amount of 40 nm) directly above the gate electrode 2 so as to be spaced apart from the gate electrode 2.

Thereafter, an In—Zn—O oxide solution was directly injected into the recessed portion 11 by using an inkjet method (a thickness of 40 nm), followed by 30-min annealing with a hot plate at 400° C. Then, the protective film 6 of SiON was deposited by RF magnetron sputtering (a thickness of 80 nm). Because the source electrode 7 and the drain electrode 8 each need to be electrically connected to the semiconductor layer 5, a photosensitive photoresist was applied in a manner that leaves the protective film 6 only at the center of the semiconductor layer 5. After exposure and development with a developer, the protective film 6 was formed by RIE. Then, an ITO was deposited in 100 nm by DC magnetron sputtering, and the source electrode 7 and the drain electrode 8 were formed. The interlayer insulating film 9 (3 μm) was then formed by spin coating using epoxy resin, and an opening was formed by photolithography in a portion that serves as a contact point for the drain electrode 8 and the pixel electrode 10. This was followed by deposition of an ITO (100 nm) by DC magnetron sputtering, and the ITO was patterned into the desired shape to form the pixel electrode 10 to fabricate the thin-film transistor. Then, an electrophoretic electronic paper front panel was attached as the display medium 12 on the fabricated thin-film transistor to complete the image display device.

Comparative Example

Figure 5:
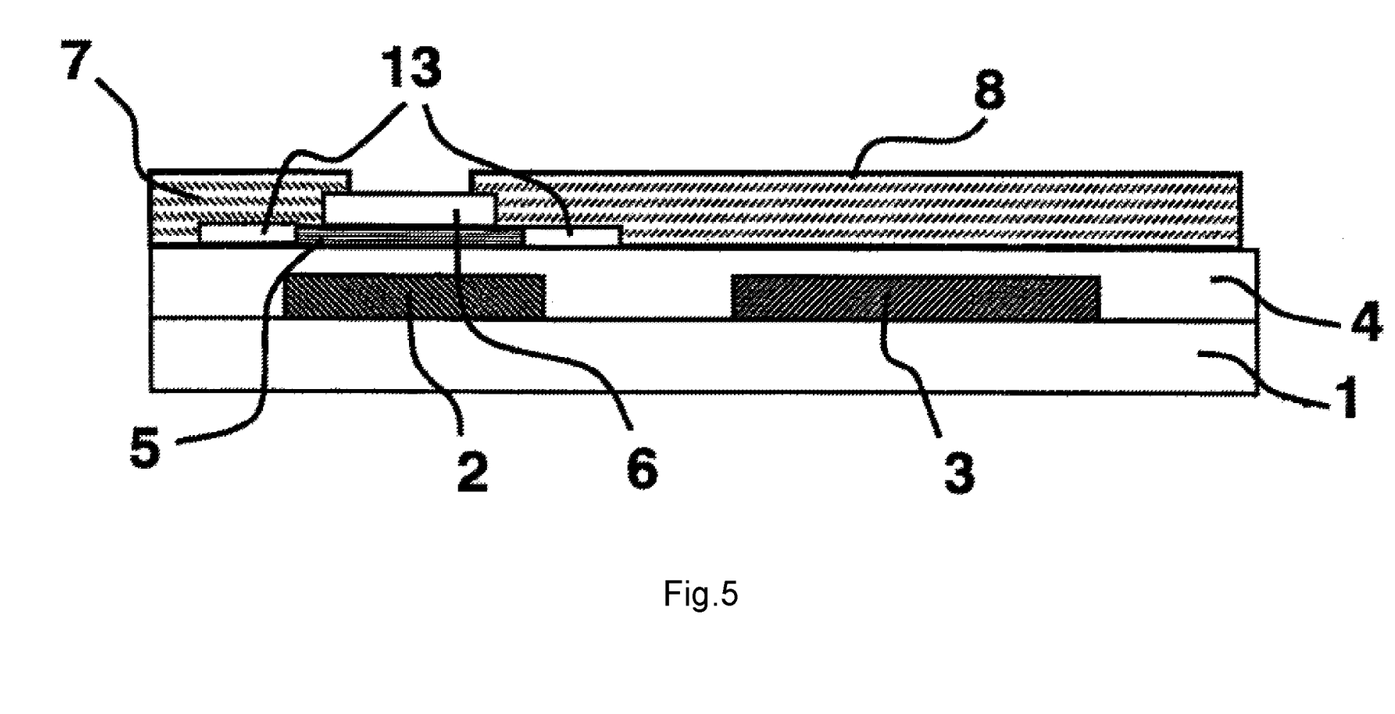
FIG. 5 is a partial cross sectional view illustrating substantially one pixel portion of a thin-film transistor according to Comparative Example.
Figure 6:
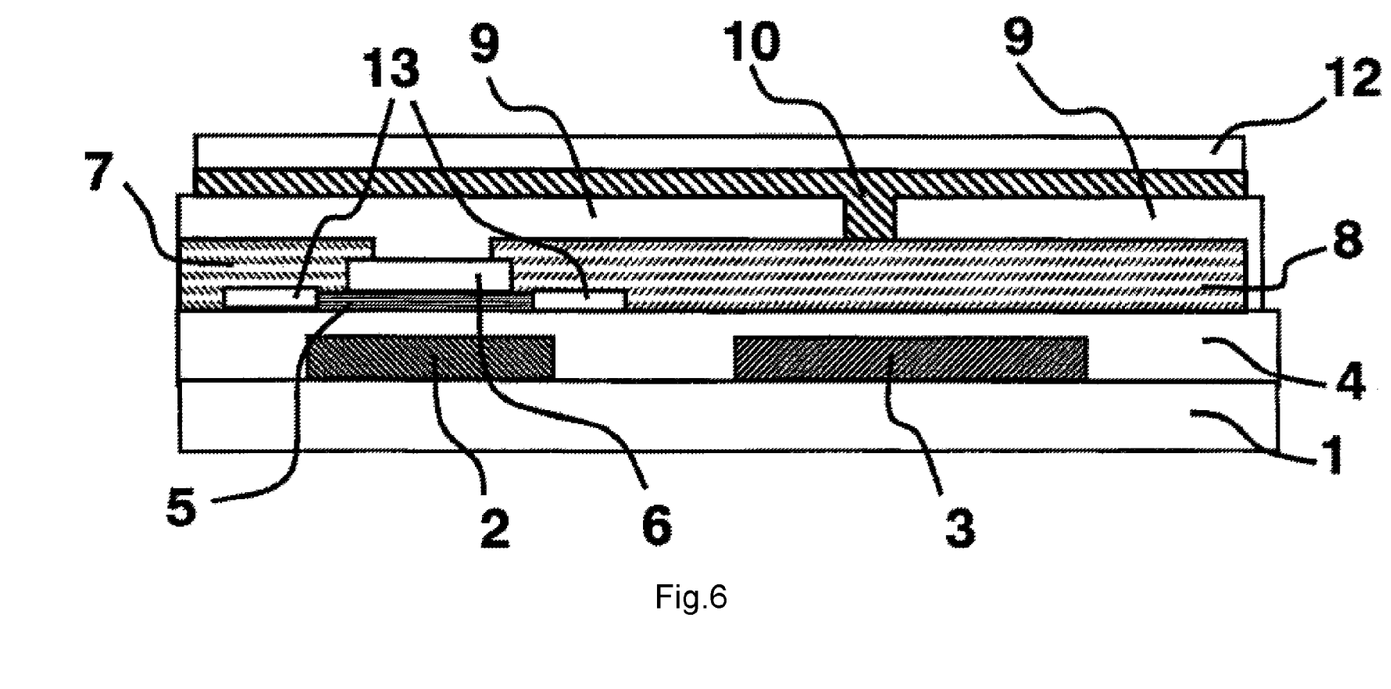
FIG. 6 is a schematic plan view of an image display device that uses the thin-film transistor according to Comparative Example.

As illustrated in FIGS. 5 and 6, an ITO was deposited on the substrate 1 in 100 nm by DC magnetron sputtering, and the gate electrode 2 and the capacitor electrode 3 were formed by photolithography. Then, the gate insulating layer 4 (SiON; a thickness of 200 nm) was formed in contact with the substrate 1, using RF magnetron sputtering, followed by formation of a partition wall 13. Then, the positive-type photosensitive polyimide Photoneece DL-1000 (Toray) was spin coated over the whole surface. The photosensitive polyimide was applied in a thickness of about 40 nm to provide a 40-nm height for the partition wall 13. The photosensitive polyimide applied over the whole surface was then exposed and developed by photolithography to form the partition wall 13 on the gate insulating layer 4. The patterning of the partition wall 13 was performed by baking in an oven at 230° C. for 30 minutes. Then, an In—Zn—O oxide solution was directly injected into the recessed portions 11 by using an inkjet method (a thickness of 40 nm), followed by annealing with a hot plate at 400° C. Then, the protective film 6 of SiON was deposited by RF magnetron sputtering (a thickness of 80 nm). Because the source electrode 7 and the drain electrode 8 each need to be electrically connected to the semiconductor layer 5, a photosensitive photoresist was applied in a manner that leaves the protective film 6 only at the center of the semiconductor layer 5. After exposure and development with a developer, the protective film 6 was formed by RIE. Then, an ITO was deposited in 100 nm by DC magnetron sputtering, and the source electrode 7 and the drain electrode 8 were formed. The interlayer insulating film 9 (3 μm) was then formed by spin coating using epoxy resin, and an opening was formed by photolithography in a portion that serves as a contact point for the drain electrode 8 and the pixel electrode 10. This was followed by deposition of an ITO (100 nm) by DC magnetron sputtering, and the ITO was patterned into the desired shape to form the pixel electrode to fabricate the thin-film transistor. Then, an electrophoretic electronic paper front panel was attached as the display medium 12 on the thin-film transistor to complete the image display device.

Upon driving the image display devices, it was found that the display quality of the image display device not provided with the partition wall 13 was comparable to that of the image display device provided with the partition wall 13.

By the provision of the recessed portion 11 directly formed in the gate insulating layer 4, it was possible to eliminate the fabrication process of the partition wall 13 formed in the image display device of the related art, and to realize isolation of the transistor devices through formation of the semiconductor solution at the desired place by coating. This made it possible to fabricate the thin-film transistor of stable characteristics with a simple fabrication process.

What is claimed is:
1. A top-contact type thin-film transistor comprising:
a substrate;
a gate electrode laminated on the substrate;
a gate insulating layer laminated on the substrate and the gate electrode;
a recessed portion provided in the gate insulating layer;
a semiconductor layer formed in the recessed portion of the gate insulating layer, wherein the semiconductor layer exists only within the recessed portion; and a source electrode and a drain electrode, both the source electrode and the drain electrode connected to the semiconductor layer at respective positions which are spaced apart from each other.

2. The top-contact type thin-film transistor according to claim 1, further comprising a protective film laminated at least on a central portion of the semiconductor layer.

3. The top-contact type thin-film transistor according to claim 1, wherein the recessed portion is formed in a portion opposite the gate electrode in a thickness direction.

4. The top-contact type thin-film transistor according to claim 1, wherein the semiconductor layer is made of a material that contains a metal oxide as a main component of the material.

5. The top-contact type thin-film transistor according to claim 1, wherein the semiconductor layer is made of a material that contains an organic substance as a main component of the material.

6. An image display device comprising:

the top-contact type thin-film transistor of claim 1;

an interlayer insulating film formed on the source electrode and the drain electrode of the thin-film transistor;

a pixel electrode formed on the interlayer insulating film and electrically connected to the drain electrode; and a display medium that includes a common electrode formed on the pixel electrode.

7. The image display device according to claim 6, wherein the display medium is any one of an electrophoretic reflective display device, a transmissive liquid crystal display device, a reflective liquid crystal display device, a semitransmissive liquid crystal display device, an organic electroluminescence display device, and an inorganic electroluminescence display device.

* * * * *